US 8,916,924 B2

(12) United States Patent
Chen

(10) Patent No.: US 8,916,924 B2
(45) Date of Patent: *Dec. 23, 2014

(54) METHOD FOR MANUFACTURING SEMICONDUCTOR DEVICE USING THIN HARD MASK AND STRUCTURE MANUFACTURED BY THE SAME

(71) Applicant: Macronix International Co., Ltd., Hsinchu (TW)

(72) Inventor: Shih-Hung Chen, HsinChu County (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/165,611

(22) Filed: Jan. 28, 2014

(65) Prior Publication Data
US 2014/0183619 A1 Jul. 3, 2014

Related U.S. Application Data
(63) Continuation-in-part of application No. 13/729,092, filed on Dec. 28, 2012, now Pat. No. 8,659,949.

(51) Int. Cl.
H01L 27/115 (2006.01)
H01L 29/792 (2006.01)
H01L 29/66 (2006.01)
H01L 29/78 (2006.01)

(52) U.S. Cl.
CPC ...... H01L 29/7926 (2013.01); H01L 29/66833 (2013.01); H01L 29/7827 (2013.01); H01L 27/11582 (2013.01)
USPC ......................................... 257/325

(58) Field of Classification Search
None
See application file for complete search history.

(56) References Cited

U.S. PATENT DOCUMENTS 8,503,228 B2    8/2013  Juengling
8,659,949 B1 *  2/2014  Chen ...................... 365/185.18
2006/0115978 A1 * 6/2006  Specht et al. .................. 438/637

FOREIGN PATENT DOCUMENTS

TW       201232554       8/2012

OTHER PUBLICATIONS

English abstract translation of TW201232554 (Published Aug. 1, 2012).

(Continued)

Primary Examiner — Seahvosh Nikmanesh
(74) Attorney, Agent, or Firm — McClure, Qualey & Rodack, LLP

(57) ABSTRACT

A method for manufacturing semiconductor device is disclosed. A substrate with a plurality of protruding strips formed vertically thereon is provided. A charging trapping layer is formed conformally on the protruding strips. A conductive layer is formed conformally on the charging trapping layer. A thin hard mask is conformally deposited on the conductive layer, wherein a plurality of trenches are formed between the thin hard mask on the protruding strips. A patterned photo resist is formed on the thin hard mask, wherein the patterned photo resist fills into the trenches. The thin hard mask is patterned according to the patterned photo resist to form a patterned hard mask layer and expose a portion of the conductive layer. The conductive layer is patterned for removing the exposed portion of the conductive layer to form a patterned conductive layer and expose a portion of the charging trapping layer.

7 Claims, 15 Drawing Sheets

(56) References Cited

OTHER PUBLICATIONS

Maeda, et al.: "Multi-stacked 1G cell/layer Pipe-shaped BiCS Flash Memory"; Center for Semiconductor Research & Development, Toshiba Corporation, Semiconductor Company 2-5-1 Kasama, Sakae-ku, Yokohama, Kanagawa, 247-8585, Japan Phone:+81-45-890-2420, Fax:+81-45-890-2893, E-mail:takashi11. maeda@toshiba.co.jp; 2009 Symposium on VLSI Circuits Digest of Technical Papers.

Ishiduki, et al.: "Optimal Device Structure for Pipe-shaped BiCS Flash Memory for Ultra High Density Storage Device with Excellent Performance and Reliability"; Center for Semiconductor Research & Development, Semiconductor Company, Toshiba Corporation; 97-4244-5640-6/09/$26.00 © 2009 IEEE.

* cited by examiner

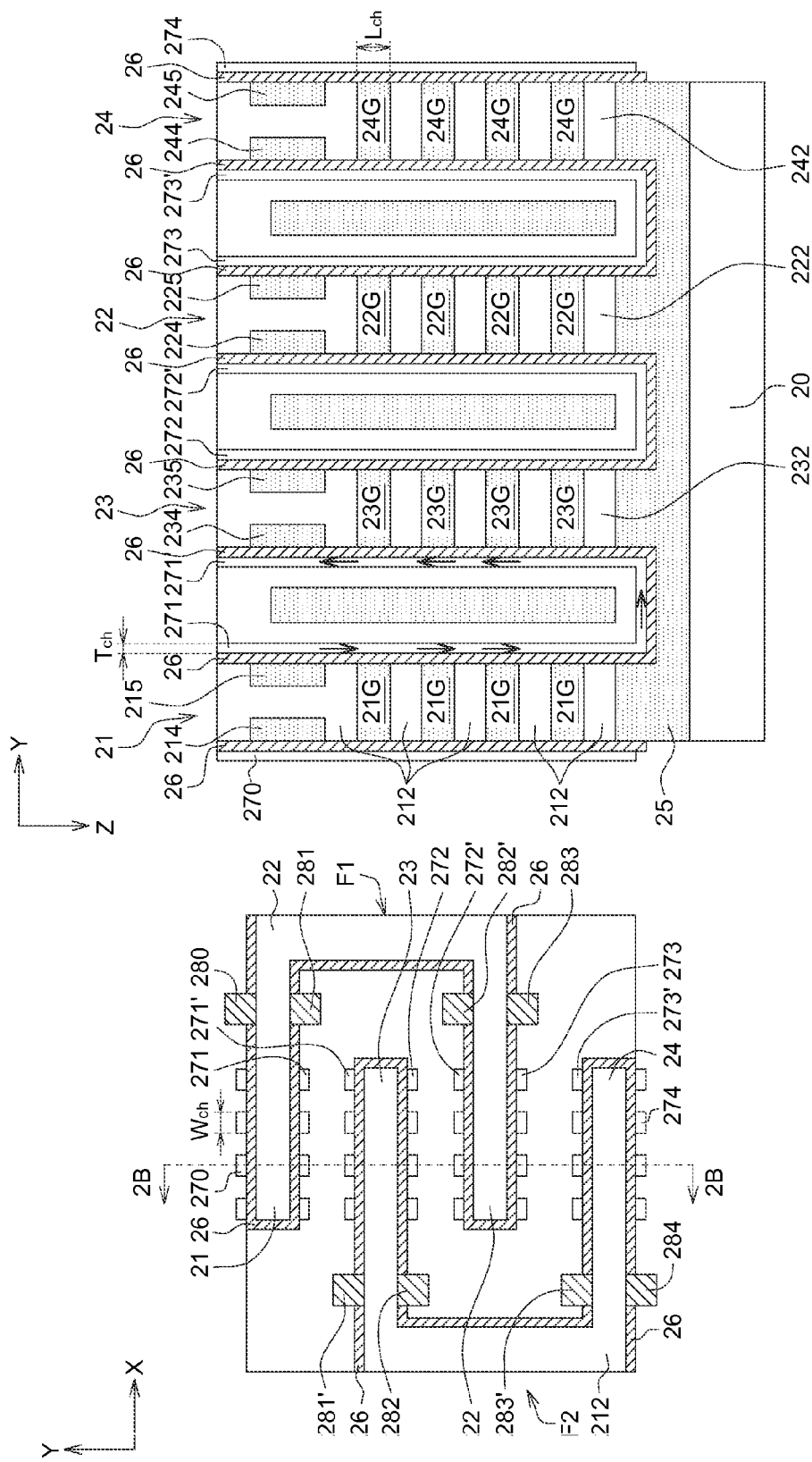

METHOD FOR MANUFACTURING SEMICONDUCTOR DEVICE USING THIN HARD MASK AND STRUCTURE MANUFACTURED BY THE SAME

This is a continuation-in-part application of U.S. application Ser. No. 13/729,092, filed Dec. 28, 2012, the contents of which are incorporated herein by reference.

BACKGROUND

1. Field of the Invention

The disclosure relates in general to a method for manufacturing semiconductor device and structure manufactured by the same, more particularly to a method for manufacturing three-dimensional (3D) semiconductor device using thin hard mask and structure manufactured by the same.

2. Description of the Related Art

A nonvolatile semiconductor memory device is typically designed to securely hold data even when power is lost or removed from the memory device. Various types of nonvolatile memory devices have been proposed in the related art. Also, manufactures have been looking for new developments or techniques combination for stacking multiple planes of memory cells, so as to achieve greater storage capacity. For example, several types of multi-layer stackable thin-film transistor (TFT) NAND-type flash memory structures have been proposed. Various semiconductor devices with three-dimensional (3D) stacked structures, having single-gate unit cells, double gate unit cells or surrounding gate unit cells, have been provided.

It is desirable to develop a semiconductor device with 3D stacked structure not only with larger number of multiple planes being stacked to achieve greater storage capacity, but also with smaller unit cells and excellent electrical properties (such as reliability and stability of data storage), so that the smaller memory elements still can be erased and programmed effectively. Moreover, the reduced dimensions of the semiconductor devices with 3D stacked structures might create the thinner and higher patterns. The thin and high patterns (ex: an aspect ratio of a height of the pattern to its width is too high) of the 3D stacked structure would be fallen down or bended easily during the manufacturing process. Therefore, it is one of the important goals to develop the related procedures for making the thinner but solid patterns of the device with 3D stacked structure. Accordingly, it is desirable to fabricate a semiconductor device with 3D stacked structure with high speed and solid construction, and that device is also manufactured by not complicated manufacturing process thereby diminishing the manufacturing cost.

SUMMARY

The disclosure relates to a method for manufacturing semiconductor device and structure manufactured by the same. The method of the embodiment adopts a thin hard mask for providing a method capable of enlarging the process window, increasing the production yield, and saving the production cost.

According to the present disclosure, a method for manufacturing semiconductor device is provided, comprising providing a substrate with a plurality of protruding strips formed vertically thereon, wherein the protruding strips are spaced apart from each other; forming a charging trapping layer conformally on the protruding strips; forming a conductive layer conformally on the charging trapping layer; depositing a thin hard mask conformally on the conductive layer, wherein a plurality of trenches are formed between the thin hard mask on the protruding strips; forming a patterned photo resist on the thin hard mask, and the patterned photo resist filling into the trenches; patterning the thin hard mask according to the patterned photo resist to form a patterned hard mask layer, and a portion of the conductive layer being exposed; and patterning the conductive layer for removing the exposed portion of the conductive layer to form a patterned conductive layer, and a portion of the charging trapping layer being exposed.

According to the present disclosure, a semiconductor device is provided, comprising a plurality of protruding strips vertically formed on a substrate; a plurality of charging trapping layers formed outsides of the protruding strips and lined between the adjacent protruding strips; a plurality of conductive layers formed outsides of the charge trapping layers and lined between the adjacent charging trapping layers; and a dielectric layer formed between the conductive layers and between the protruding strips. Each protruding strip is a multilayer structure, comprising a plurality of conductive layers and a plurality of insulating layers alternately stacked on an insulation surface of the substrate.

The disclosure will become apparent from the following detailed description of the preferred but non-limiting embodiments. The following description is made with reference to the accompanying drawings.

BRIEF DESCRIPTION OF THE DRAWINGS

FIG. 2A is a top view of a VC 3D memory structure according to one of the applications manufactured by the embodiment of the present disclosure.

FIG. 2B is a cross-sectional view of the 3D memory structure along the cross-sectional line 2B-2B of FIG. 2A.

DETAILED DESCRIPTION

Figure 1A:
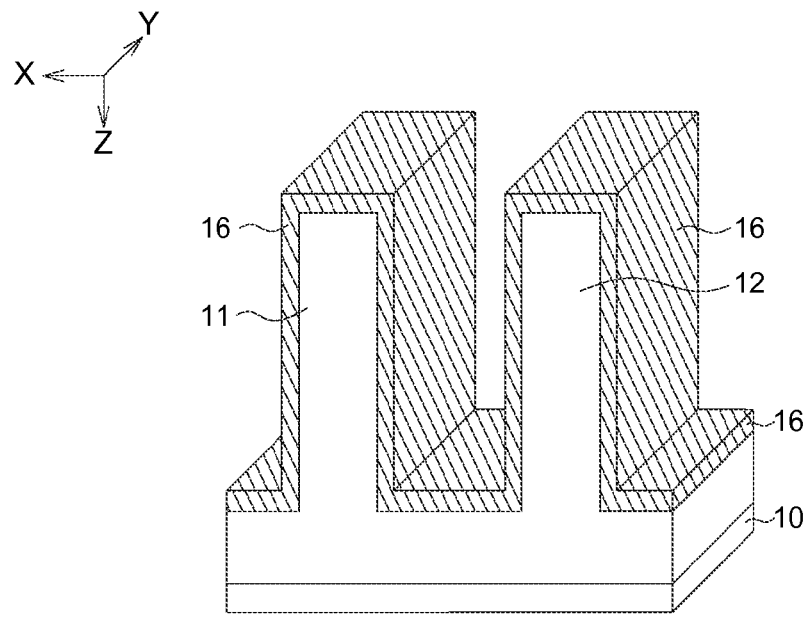
FIG. 1A~FIG. 1H illustrate a method for manufacturing a semiconductor device according to the embodiment of the disclosure.

The embodiments of the present disclosure disclosed below are for elaborating a method for manufacturing semiconductor device and structure manufactured by the same. A thin hard mask is adopted in the manufacturing method of the embodiment. Therefore, the method of the embodiment not only enlarges the process window and increases the production yield, but also saves the production cost. The disclosure is applicable to any of three-dimensional (3D) semiconductor structures, such as a vertical-channel (VC) 3D semiconductor device or a vertical-gate (VG) 3D semiconductor device. However, the descriptions disclosed in the embodiments of the disclosure such as detailed construction, manufacturing steps and material selections are for illustration only, not for limiting the scope of protection of the disclosure.

Embodiments are provided hereinafter with reference to the accompanying drawings for describing the related configurations and procedures, but the present disclosure is not limited thereto. The identical and/or similar elements of the embodiments are designated with the same and/or similar reference numerals. Also, it is noted that there may be other embodiments of the present disclosure which are not specifically illustrated. It is also important to point out that the illustrations may not be necessarily be drawn to scale. Thus, the specification and the drawings are to be regard as an illustrative sense rather than a restrictive sense.

FIG. 1A~FIG. 1H illustrate a method for manufacturing a semiconductor device according to the embodiment of the disclosure. As shown in FIG. 1A, a substrate 10 is provided, and a plurality of protruding strips (such as the protruding strips 11 and 12 for exemplification) are vertically formed on the substrate 10. The substrate 10 could be a base plate with an insulation layer such as an oxide layer (ex: silicon oxide) formed thereon. The protruding strips 11 and 12 are spaced apart from each other. Also, a charging trapping layer 16 is conformally formed on the protruding strips 11 and 12.

According to the disclosure, the manufacturing method of the embodiment could be applied to a 3D semiconductor device with a conductive strip (i.e., the protruding strip is made of conductive material) as illustrated in 1A (~FIG. 1H), or could be applied to a 3D semiconductor device with a protruding strip comprising the multilayer with the alternately stacked conductive layers and insulating layers (such as gates and gate insulators of a 3D vertical-channel (VC) semiconductor device, or bit lines and insulators of a 3D vertical-gate (VG) semiconductor device, which are described in details later). There is no particular limitation in the disclosure.

Figure 1B:
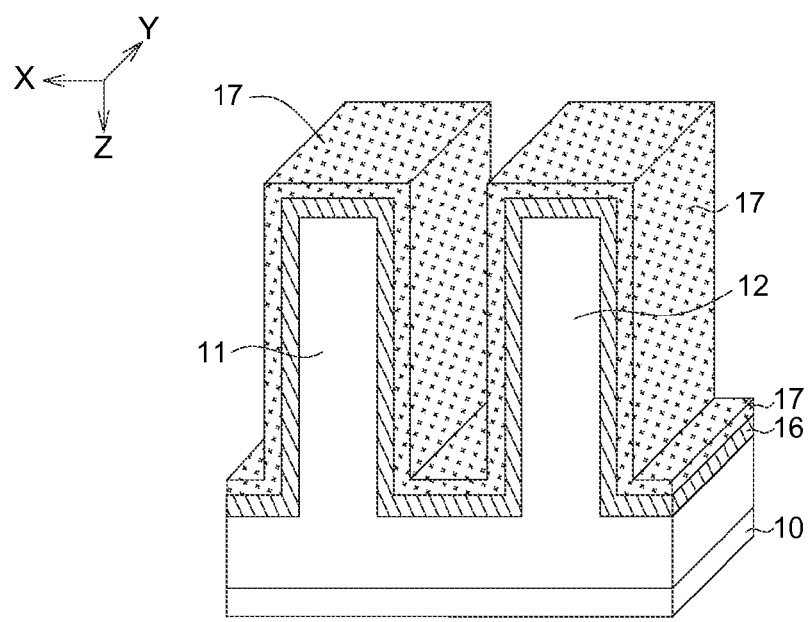

As shown in FIG. 1B, a conductive layer 17 is conformally formed on the charging trapping layer. Materials of the conductive layer 17 could be undoped polysilicon, heavy doped polysilicon layer or metal, depending on the requirements of the practical applications. For example, for an application of a VC semiconductor device, the conductive layer 17 is an undoped polysilicon layer, functioning as channel of the VC semiconductor device after subsequent manufacturing process. For a VG semiconductor device, the conductive layer 17 is a heavy doped polysilicon layer (such as n/p type dopants with a doping concentration larger than $10^{21}/cm^3$) or a metal layer (such as ALD/CVD TiN, TaN, W or a combination), functioning as gate of the VG semiconductor device after subsequent manufacturing process.

Figure 1C:
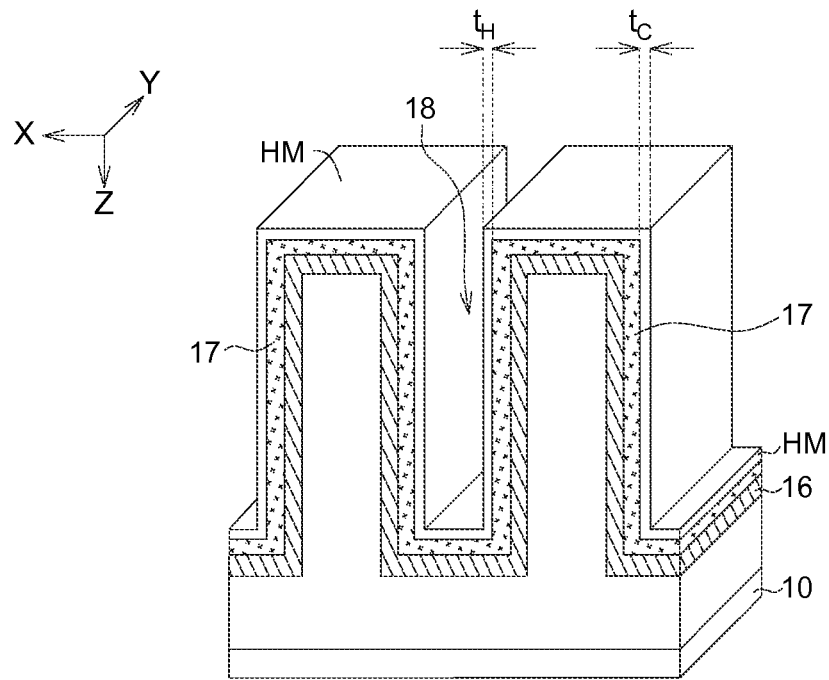

As shown in FIG. 1C, a thin hard mask HM is then conformally deposited on the conductive layer, and a plurality of trenches are formed between the thin hard mask HM on the protruding strips 11 and 12. For example, a trench 18 is formed between the sidewalls of the thin hard mask HM on the adjacent protruding strips 11 and 12. The thin hard mask of the embodiment may comprise, but not limited to, silicon nitride (SiN), silicon oxynitride (SiON), silicon oxide ($SiO_2$), or combination thereof.

According to the embodiment, a thickness $t_H$ of the thin hard mask HM is equal to or less than a thickness $t_C$ of the conductive layer 17. In one embodiment, the thickness $t_C$ of the conductive layer 17 is in a range of about 50 Å to about 200 Å. In one embodiment, the thickness $t_H$ of the thin hard mask HM is in a range of about 50 Å to about 150 Å. Noted that those numerical values are disclosed for exemplification, not for limitation.

Next, a thick PR is deposited for capping the structure, and then pattened to form a mask for the subsequent procedures.

Figure 1D:
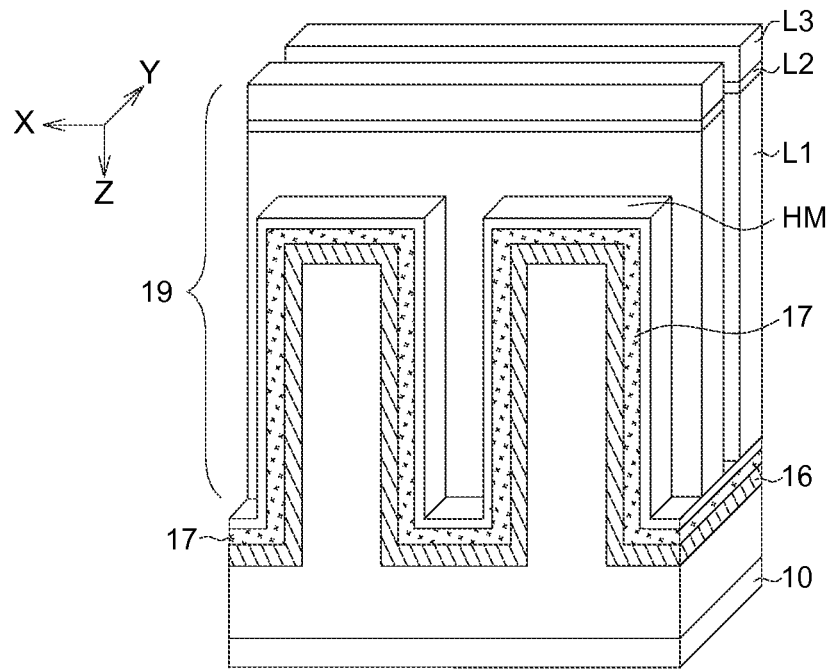

As shown in FIG. 1D, a patterned photo resist 19 is formed on the thin hard mask HM and fills into the trenches 18.

In the embodiment, the patterned photo resist 19 covers the thin hard mask HM, the conductive layer 17 and the protruding strips 11 and 12. In one embodiment, the patterned photo resist 19 could be a multilayer, such as an organic distribution resist (ODL) L1, a silicon-containing hard-mask bottom anti-reflection coating layer (SHB) L2, and a photo resist L3. The ODL L1 is deposited on the thin hard mask HM firstly for planarization, and the SHB L2 is deposited on the ODL L1, and the photo resist L3 is formed on the SHB L2.

Figure 1E:
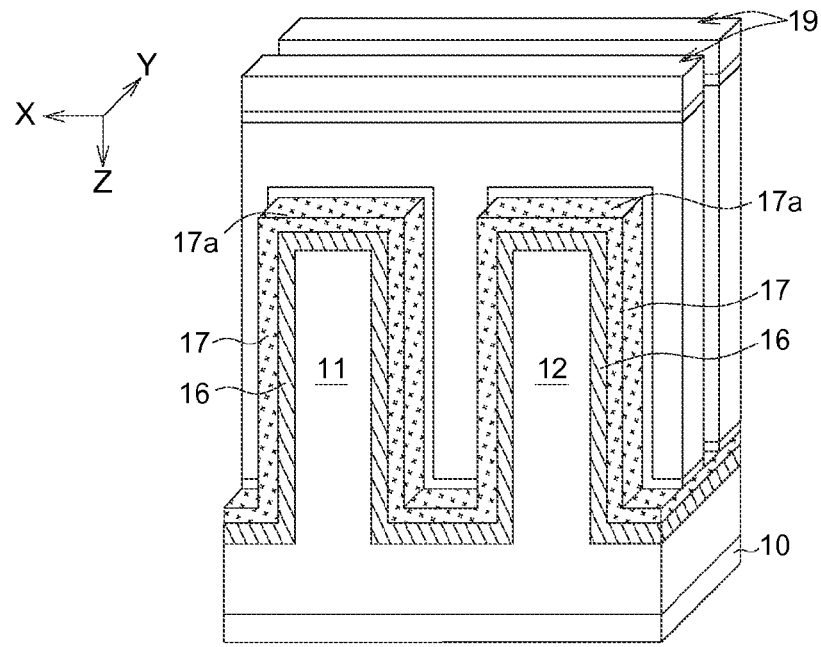

The thin hard mask HM is patterned according to the patterned photo resist 19 to form a patterned hard mask layer HM', and a portion 17a of the conductive layer 17 is exposed, as shown in FIG. 1E. In one embodiment, the thin hard mask HM is patterned by isotropic etch to form the patterned hard mask layer HM'. Although the isotropic etch to the thin hard mask HM targets in X-direction and Z-direction (not in Y-direction), are the target etching directions, the isotropic etch to the hard mask in Y-direction may have some loss. Since the hard mask HM of the embodiment is thin (ex: 50 Å to about 150 Å), the isotropic etch along Y-direction of the thin hard mask HM will be controlled.

Figure 1F:
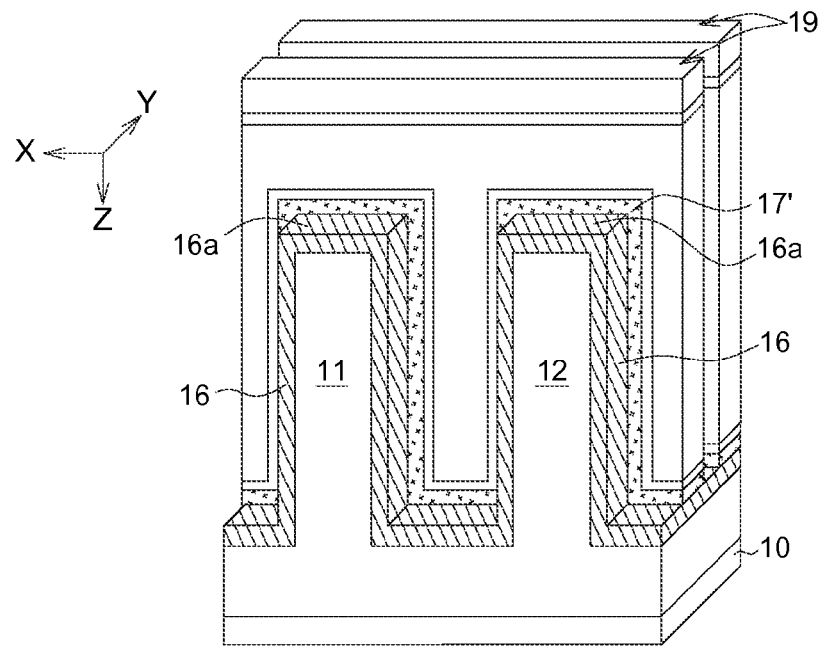

The conductive layer 17 is patterned for removing the exposed portion 17a of the conductive layer 17 to form a patterned conductive layer 17', and a portion 16a of the charging trapping layer 16 is exposed, as shown in FIG. 1F. In one embodiment, the conductive layer 17 is patterned by isotropic etch to form the patterned conductive layer 17'. Similarly, since the conductive layer 17 of the embodiment is thin (ex: 50 Å to about 200 Å), the isotropic etch along Y-direction of the conductive layer 17 will be controlled.

Figure 1G:
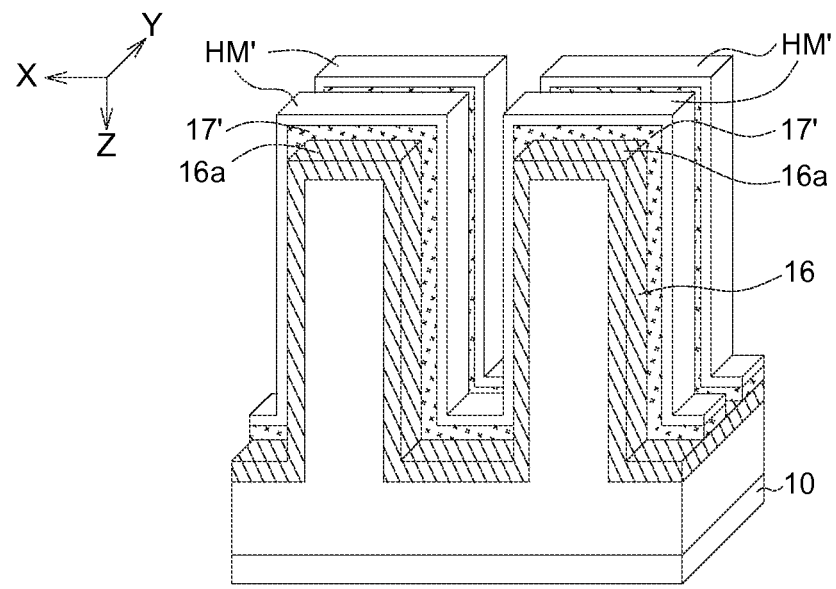

Then, the patterned photo resist 19 is removed (stripped), as shown in FIG. 1G. It is shown in FIG. 1G that the patterned hard mask layer HM' is substantially conformal with the patterned conductive layer 17' after the patterned photo resist 19 is removed.

It is noted that the manufacturing steps of the embodiment could be modified and changed in practical applications, and not limited to the illustrated drawings. For example, the PR strip can be performed before etching the conductive layer 17. As described in FIG. 1E~FIG. 1G, the patterned photo resist 19 is removed after patterning the conductive layer 17 (i.e., the exposed portion 17a of the conductive layer 17 is patterned according to patterned photo resist 19 to form the patterned conductive layer 17'). However, the disclosure is not limited thereto. In an alternative embodiment, the patterned photo resist 19 can be removed before patterning the conductive layer 17 (i.e., the exposed portion 17a of the conductive layer 17 is patterned according to the patterned hard mask layer HM' to form the patterned conductive layer 17').

Figure 1H:
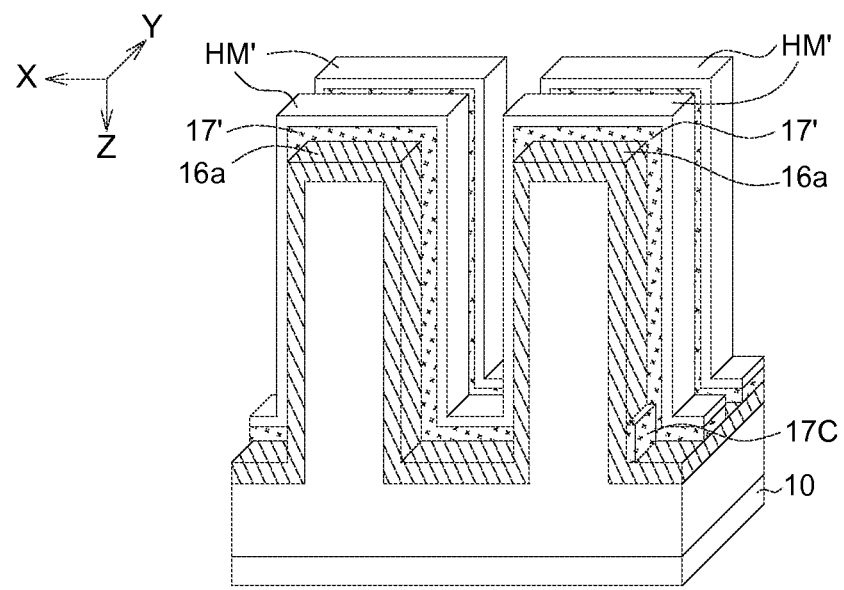

FIG. 1G shows that the conductive layer 17 is removed (stripped) completely. However, one step to completely remove the conductive layer 17 is an ideal case. In realistic case, conductive residues (such as poly of the conductive layer 17) is usually remained and needed to be further treated. FIG. 1H shows the conductive residues 17C remained after patterned photo resist 19 is removed. As shown in FIG. 1H, the conductive residues 17C is usually remained close to the bottom of the protruding strips 11/12, and requires to be further stripping treatment, such as an oxidization process to oxidize the residue 17C. In one embodiment, the conductive residue 17C is thinner than the conductive layer 17, which would need much oxidation for treatment. Oxidation in y-direction will be controlled. Also, the conductive layer 17 is covered by the hard mask layer HM, so that the oxidation along x-direction will be controlled. In one embodiment, the hard mask layer HM is made of SiN based material, which can prevent oxygen penetration and will be a good choice for this concern. In another embodiment, the hard mask layer HM made of SiO2 based material will also work. Since the oxygen penetration is reduced or stopped, the loss of the conductive layer 17 can be decreased or avoided.

According to the thin hard mask and related steps adopted in the embodiment, since no more thick conductive blocks required to be patterned (etched), the time for manufacturing method can be saved, thereby reducing the manufacturing cost. Also, the device of the embodiment has more solid structure and reliable electrical properties because the deformed or collapsed issues can be effectively solved. Therefore, the method of the embodiment adopting the thin hard mask not only enlarges the process window and increases the production yield, but also saves the production cost.

Two types of 3D semiconductor devices, i.e. a vertical-channel (VC) 3D semiconductor device and a vertical-gate (VG) 3D semiconductor device, are exemplified hereinafter with reference to the accompanying drawings for illustrating the related applications manufactured by the embodied method, but the present disclosure is not limited thereto. It is noted that not all embodiments of the invention are shown. Modifications and variations can be made without departing from the spirit of the disclosure to meet the requirements of the practical applications. The identical or similar elements are designated by the same or similar reference numbers.

Vertical-channel (VC) 3D Semiconductor Device

In this application, a VC 3D semiconductor device manufactured according to the method of the embodiment, and the VC 3D memory structure is disclosed below.

Please refer to FIG. 2A and FIG. 2B. FIG. 2A is a top view of a VC 3D memory structure according to one of the applications manufactured by the embodiment of the present disclosure. FIG. 2B is a cross-sectional view of the 3D memory structure along the cross-sectional line 2B-2B of FIG. 2A. Also, FIG. 2A and FIG. 2B show the 3D memory structure in a xy-plane and a zy-plane, respectively. In this application, the 3D memory structure comprises a plurality of protruding strips (21-24) comprising stacked structures vertically (z-direction) formed on a substrate 20. As shown in FIG. 2A, the 3D memory structure may comprise (but not limited) a first finger-shaped stacked section F1 and a second finger-shaped stacked section F2 vertically formed on the substrate and staggered oppositely. The first finger-shaped stacked section F1 at least includes a first protruding strip with stacked structure 21 and a second protruding strip with stacked structure 22 extending along −x direction in the xy-plane. The second finger-shaped stacked section F2 at least includes a third protruding strip with stacked structure 23 and a fourth protruding strip with stacked structure 24 extending along +x direction in the xy-plane. The third protruding strip with stacked structure 23 extends between the first and the second protruding strips with stacked structures 21 and 22, while the second protruding strip with stacked structure 22 extends between the third and the fourth protruding strips with stacked structures 23 and 24. As shown in FIG. 2B, from bottom to top and along the z direction, each of the first to fourth protruding strips with stacked structures 21-24 comprises a bottom gate 25, a plurality of gates 21G/22G/23G/24G and gate insulators 212/222/232/242 alternately stacked on the bottom gate 25, and two selection lines 214/224/234/244 and 215/225/235/245 independently formed above the gates 21G/22G/23G/24G. The bottom gates 25 of the first to fourth protruding strips with stacked structures 21-24 are electrically connected to each other, to form an U-shaped bottom gate (UBG) for being a pass gate. The gates 21G/22G/23G/24G function as the word lines of the 3D memory structure. In one of the protruding strips with stacked structures 21-24, the selection lines above the gate are spaced apart form each other and independently controlled. In the embodiment, the gates and the selection lines are made of conductive material such as heavily doped polysilicon. In the embodiment, the layer of selection lines is thicker than the layer of each gate, but the disclosure is not limited thereto. The 3D memory structure of the application further comprises a plurality of charge trapping layers 26 (such as a multilayer comprising ONO or ONONO) formed outsides of the first to fourth protruding strips with stacked structures 21-24 and extending to the bottom gates 25. The charge trapping layers 26 between two adjacent protruding strips with stacked structures present an U-shaped cross-section (FIG. 2B). The 3D memory structure of FIG. 2B further comprises a plurality of ultra-thin channels 270, 271, 271', 272, 272', 273, 273' and 274 formed at outsides of the charge trapping layers 26 and lined between the adjacent protruding strips with stacked structures. The ultra-thin channels are formed at outsides of the charge trapping layers 26 and extend downwardly, wherein two of the ultra-thin channels (ex: 271+271', 272+272', 273+273') between the opposite sides of adjacent stacked structures of the first to fourth protruding strips with stacked structures 21-24 correspondingly constitute an ultra-thin U-shaped channel. The current path in the ultra-thin U-shaped channel is denoted by the arrows in FIG. 2B.

In the embodiment, the two selection lines of each protruding strips with stacked structure are two string selection lines (SSLs) or two ground selection lines (GSLs), and the charge trapping layers 26 between the adjacent stacked structures are electrically connected to one string selection line SSL and one ground selection line GSL. For example, the selection lines 214 and 215 of the first protruding strip with stacked structure 21 and the selection lines 224 and 225 of the second protruding strip with stacked structure 22 in FIG. 2B are GSLs, while the selection lines 234 and 235 of the third protruding strip with stacked structure 23 and the selection lines 244 and 245 of the fourth protruding strip with stacked structure 24 in FIG. 2B are SSLs. For the adjacent protruding strips with stacked structures, such as the first and third protruding strips with stacked structures 21 and 23, the charge trapping layers 26 beside the ultra-thin channels (ex: 271 and 271') are electrically connected to one GSL (215) and one SSL (234). The adjacent SSL and GSL function as a switch of the corresponding ultra-thin U-shaped channel. For example, the ultra-thin U-shaped channel (271+271') between the first protruding strip with stacked structure 21 and the third protruding strip with stacked structure 23 can be selectively turned on by the adjacent SSL 215 and SSL 234. In this application, a thickness of each gate 21G/22G/23G/24G is defined as a channel length (Lch) as denoted in FIG. 2B. A channel width (Wch) is denoted in FIG. 2A. The 3D memory structure further comprise a plurality of word line selectors (WLS) 280, 281, 281', 282, 282', 283, 283' and 284, respectively disposed at two sides of one end of each protruding strip with stacked structure (21/22/23/24) and electrically connected to the charge trapping layers 26.

The method of the embodiment can be applied for fabricating the VC 3D semiconductor device, especially for fabricating the structure with the ultra-thin channels 270, 271, 271', 272, 272', 273, 273' and 274 of FIG. 2B.

FIG. 3A~FIG. 3H illustrate a method for manufacturing a VC 3D semiconductor device by applying the embodiment of the disclosure. It is noted that the VC 3D semiconductor device presented FIG. 3A~FIG. 3H have been simplified for clearly describing the manufacturing method. The details of one of the VC 3D memory structures have been shown in FIG. 2A and FIG. 2B. Additionally, please also refer to FIG. 1A to FIG. 3H for the same details of manufacturing steps, which are not redundantly repeated herein.

Figure 3A:
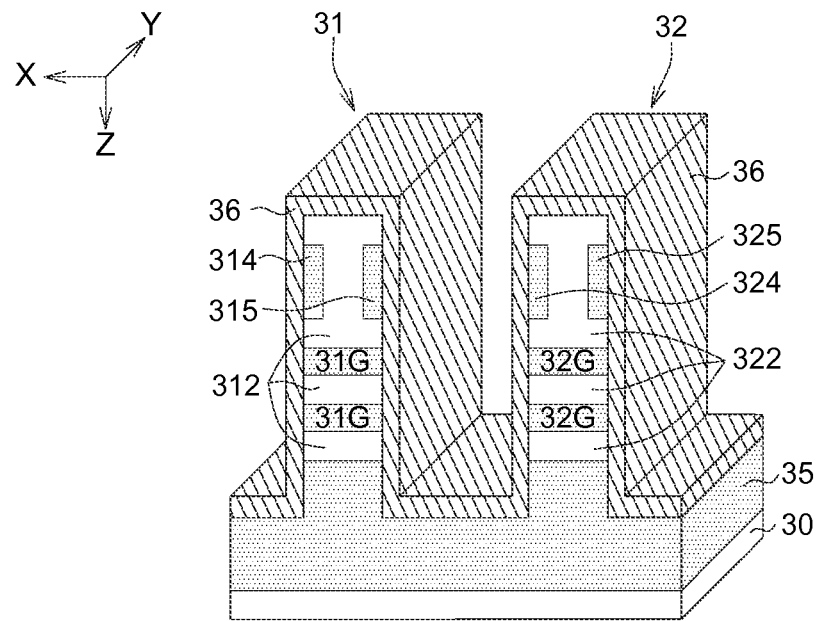
FIG. 3A~FIG. 3H illustrate a method for manufacturing a VC 3D semiconductor device by applying the embodiment of the disclosure.

As shown in FIG. 3A, a substrate 30 is provided, and a plurality of protruding strips (such as the protruding strips 31 and 32) are vertically formed on the substrate 30. The protruding strips 31 and 32 are spaced apart from each other. Also, a charging trapping layer 36 (ex: ONO or ONONO) is conformally formed on the protruding strips 31 and 32.

For the vertical-channel (VC) semiconductor device, each of the protruding strips 31 and 32 is a multilayer structure, comprising a plurality of conductive layers (such as the gates 31G and 32G) and a plurality of insulating layers (such as the gate insulators 312 and 322) alternately stacked on an insulation surface of the substrate 30. The conductive layers (such as gates 31G and 32G) of the protruding strips 31 and 32 may be made of polysilicon. An insulation layer, such as Si02, is formed on the substrate 30 for providing the insulation surface, and a polysilicon (as the bottom gate 35) is formed on the Si02 layer and connected to the bottom conductive layers (i.e. 31G and 32G) of the protruding strips 31 and 32, as shown in FIG. 3A. The conductive layers (such as the gates 31G and 32G) of the protruding strips 31 and 32 are made of the same material as the bottom gate 35 (ex: polysilicon) for the facility of the process.

Figure 3B:
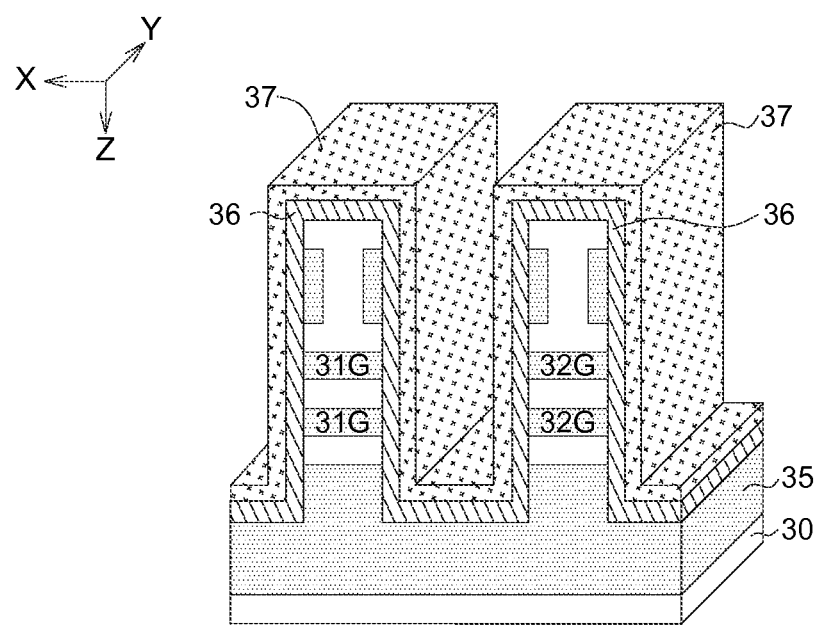

As shown in FIG. 3B, a conductive layer 37 is conformally formed on the charging trapping layer 36. For the application of a VC semiconductor device, the conductive layer 37 could be an undoped polysilicon layer, functioning as channel of the VC semiconductor device after subsequent manufacturing process.

Figure 3C:
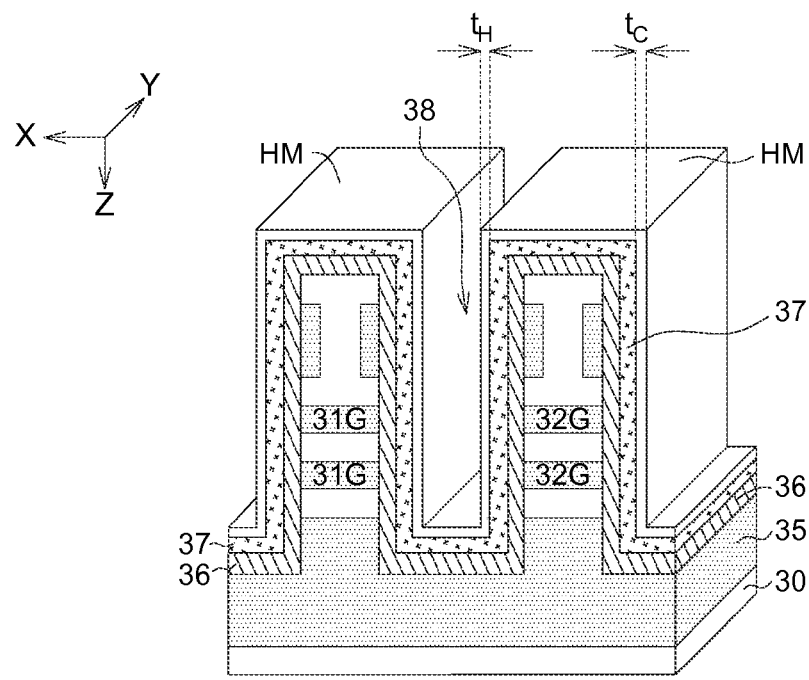

As shown in FIG. 3C, a thin hard mask HM is then conformally deposited on the conductive layer 37, and a plurality of trenches 38 are formed between the thin hard mask HM on the protruding strips 31 and 32. For example, a trench 38 is formed between the sidewalls of the thin hard mask HM on the adjacent protruding strips 31 and 32. The thin hard mask HM may comprise, but not limited to, silicon nitride (SiN), silicon oxynitride (SiON), silicon oxide ($SiO_2$), or combination thereof. Also, a thickness $t_H$ of the thin hard mask HM is equal to or less than a thickness $t_C$ of the conductive layer 37. In one embodiment, the thickness $t_C$ of the conductive layer 37 is in a range of, but not limited to, about 50 Å to about 200 Å. In one embodiment, the thickness $t_H$ of the thin hard mask HM is in a range of, but not limited to, about 50 Å to about 150 Å.

Figure 3D:
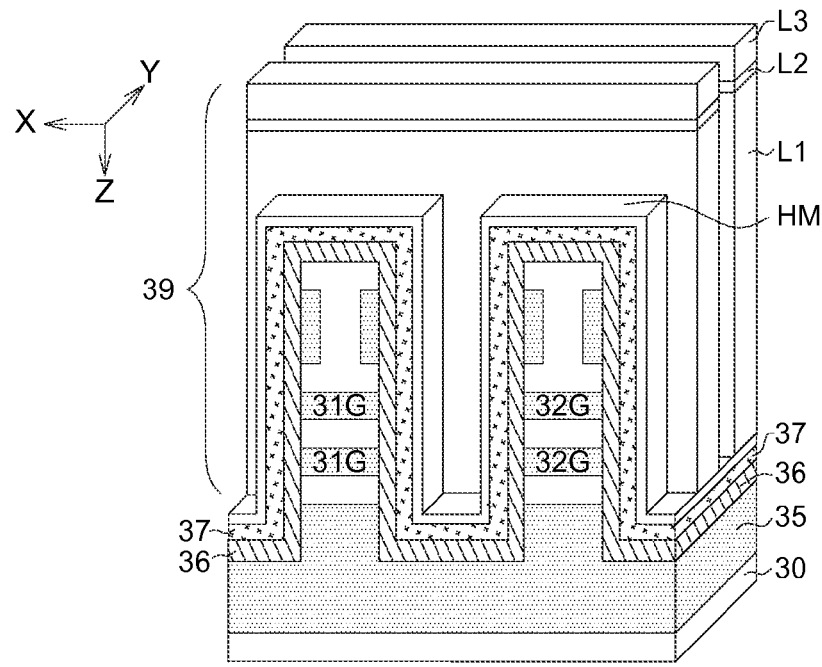

Next, a patterned photo resist 39 is formed on the thin hard mask HM and fills into the trenches 38, as shown in FIG. 3D. In one embodiment, the patterned photo resist 39 could be a multilayer, such as an ODL L1, a SHB L2, and a photo resist L3.

Figure 3E:
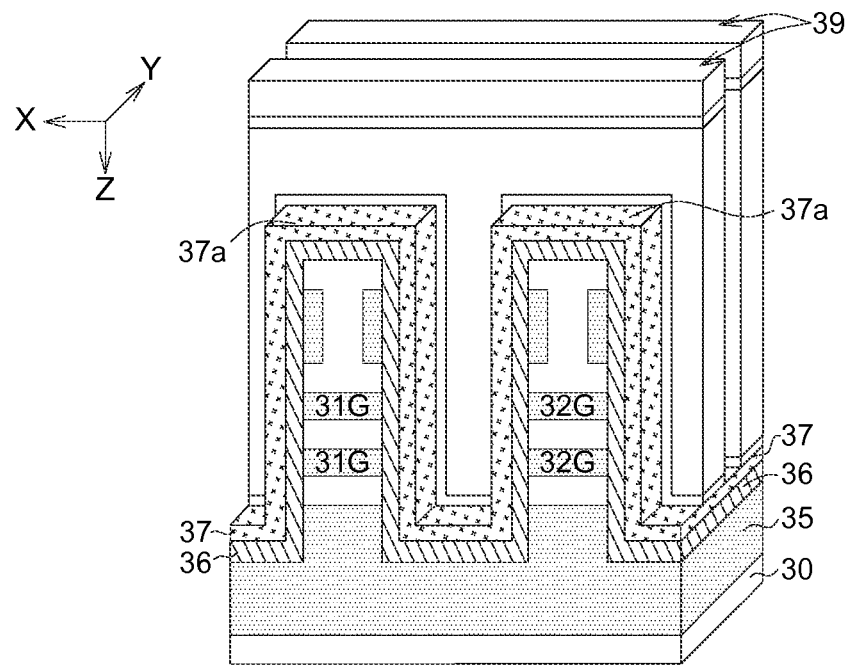

The thin hard mask HM is then patterned by isotropic etch according to the patterned photo resist 39 to form a patterned hard mask layer HM', and a portion 37a of the conductive layer 37 is exposed, as shown in FIG. 3E. Since the hard mask HM of the embodiment is thin (ex: 50 Å to about 150 Å), the isotropic etch along Y-direction of the thin hard mask HM will be controlled.

Figure 3F:
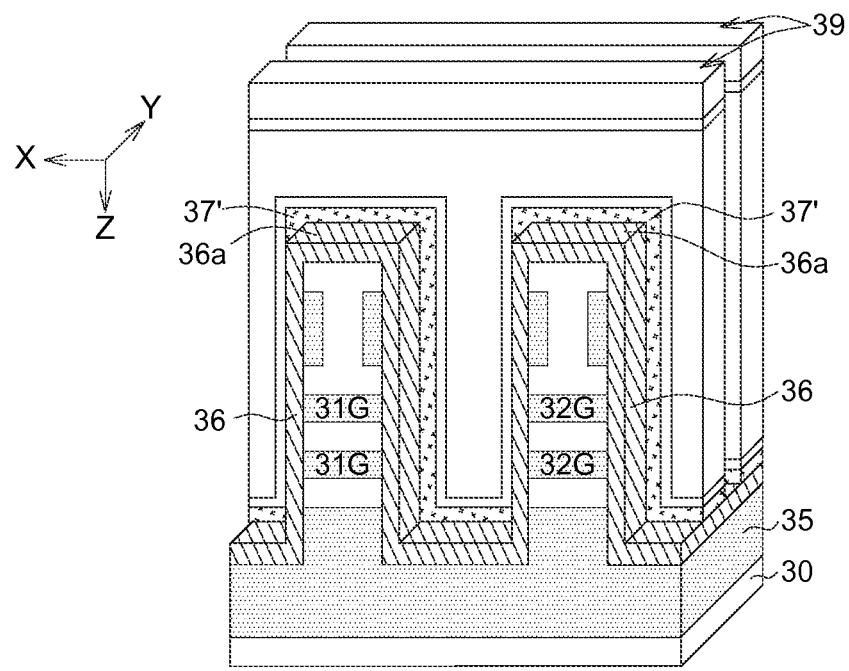

Next, the conductive layer 37 is patterned by isotropic etch, for removing the exposed portion 37a of the conductive layer 37, to form a patterned conductive layer 37' and expose a portion 36a of the charging trapping layer 36, as shown in FIG. 3F. Since the conductive layer 37 of the embodiment is thin (ex: 50 Å to about 200 Å), the isotropic etch along Y-direction of the conductive layer 37 will be controlled.

Figure 3G:
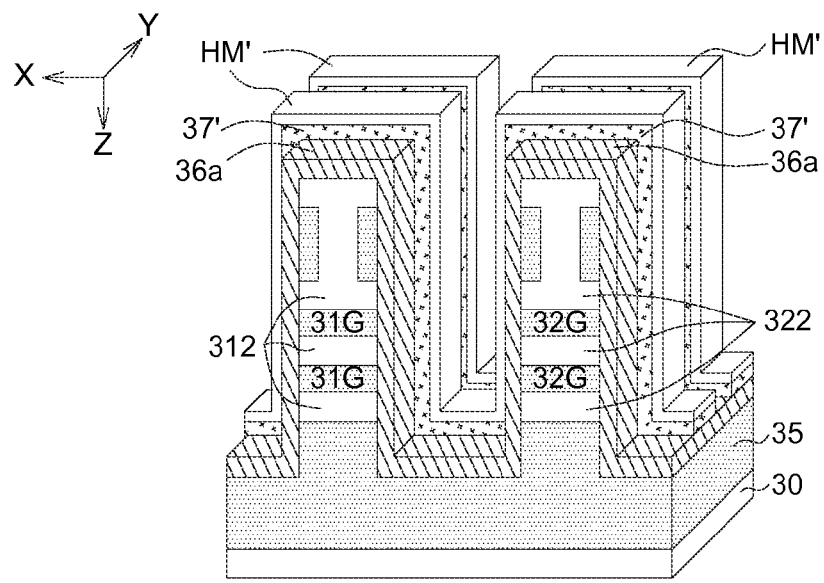
Figure 3H:
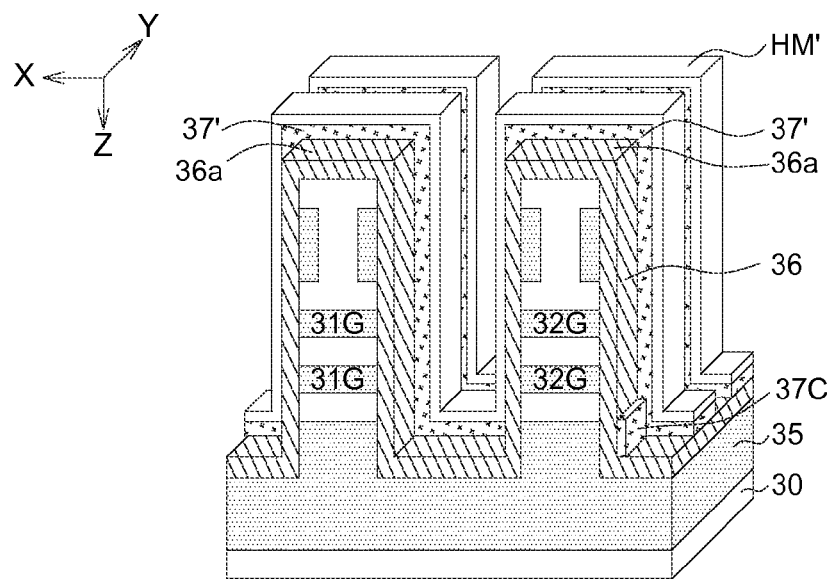

Then, the patterned photo resist 39 is removed (stripped), as shown in FIG. 3G. It is shown in FIG. 3G that the patterned hard mask layer HM' is substantially conformal with the patterned conductive layer 37' after the patterned photo resist 39 is removed. Similarly, the removal of the patterned photo resist 39 can be performed before etching the conductive layer 37. Realistically, the method may further comprise the step of removing the conductive residues 37C of FIG. 1H, such as by an oxidization process.

Vertical-gate (VG) 3D Semiconductor Device

In this application, a VG 3D semiconductor device can be manufactured according to the method of the embodiment, and the related steps are described below. The identical or similar elements are designated by the same or similar reference numbers, and the structural details and related steps are not redundantly described.

FIG. 4A~FIG. 4G illustrate a method for manufacturing a VG 3D semiconductor device by applying the embodiment of the disclosure. It is noted that the VG 3D semiconductor device presented FIG. 4A~FIG. 4G have been simplified for clearly describing the manufacturing method. The details of one of the VG 3D memory structures could be modified depending on different applications. Additionally, please also refer to FIG. 1A to FIG. 3H for the same details of manufacturing steps, which are not redundantly repeated herein.

Figure 4A:
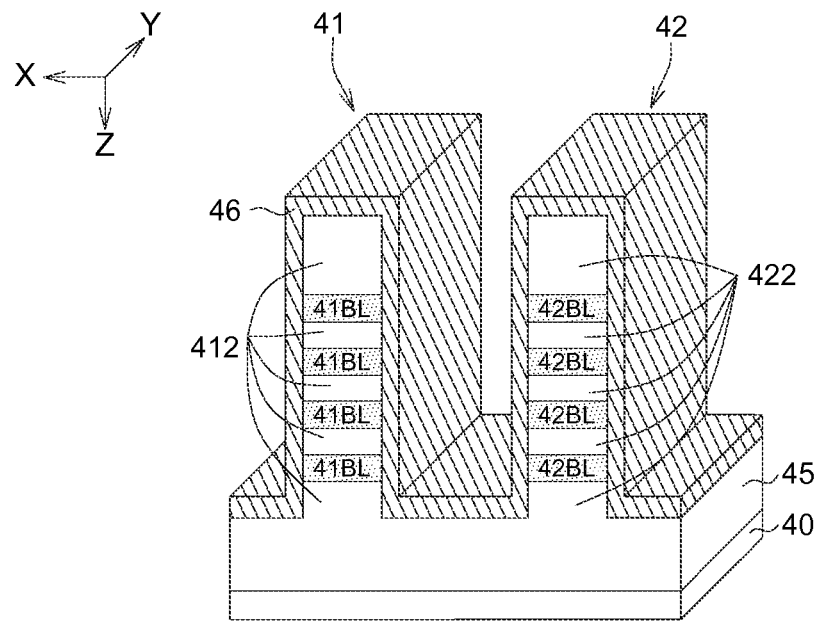
FIG. 4A~FIG. 4H illustrate a method for manufacturing a VG 3D semiconductor device by applying the embodiment of the disclosure.

As shown in FIG. 4A, a substrate 40 is provided, and a plurality of protruding strips (such as the protruding strips 41 and 42) are vertically formed on the substrate 40. The protruding strips 41 and 42 are spaced apart from each other. Also, a charging trapping layer 46 (ex: ONO or ONONO) is conformally formed on the protruding strips 41 and 42.

For the vertical-gate (VG) semiconductor device, each of the protruding strips 41 and 42 is a multilayer structure, comprising a plurality of conductive layers (such as the bit lines 41BL and 42 BL) and a plurality of insulating layers (such as the insulators 412 and 422) alternately stacked on an insulation surface of the substrate 40. The conductive layers (such as bit lines 41BL and 42 BL) of the protruding strips 41 and 42 may be made of polysilicon. An insulation layer 45, such as SiO2, is formed on the substrate 40 for providing the insulation surface, and connected to the bottom insulating layers (such as 412 and 422) of the protruding strips 41 and 42, as shown in FIG. 4A. The insulation layer 45 on the substrate 40 and the insulating layers 412 and 422 of the protruding strips 41 and 42 could be made of the same material, such as SiO2.

Figure 4B:
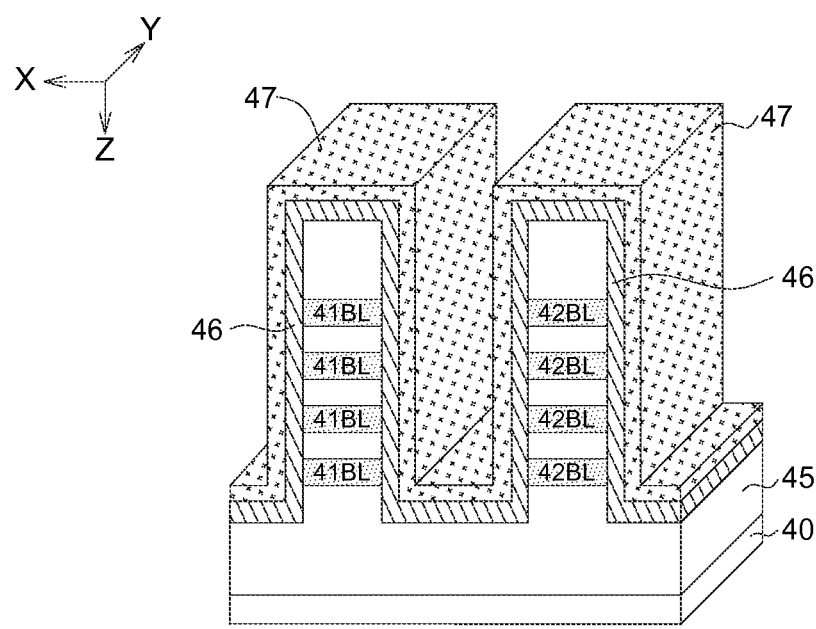

As shown in FIG. 4B, a conductive layer 47 is conformally formed on the charging trapping layer 46. For the application of a VG semiconductor device, the conductive layer 47 could be a heavy doped polysilicon layer (such as n/p type dopants with a doping concentration larger than $10^{21}/cm^3$) or a metal layer (such as TiN, TaN, W or a combination), functioning as gate of the VG semiconductor device after subsequent manufacturing process.

Figure 4C:
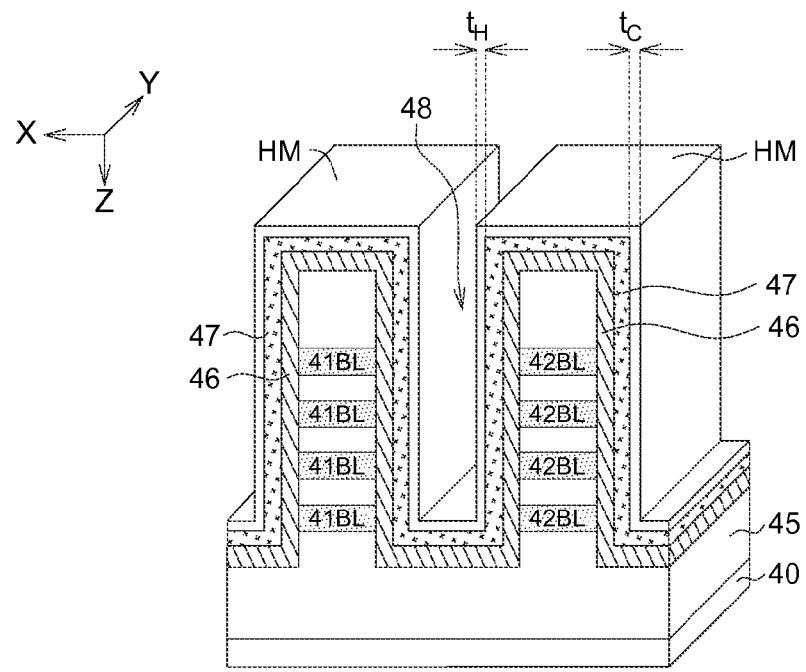

As shown in FIG. 4C, a thin hard mask HM is then conformally deposited on the conductive layer 47, and a plurality of trenches 48 are formed between the thin hard mask HM on the protruding strips 41 and 42. For example, a trench 48 is formed between the sidewalls of the thin hard mask HM on the adjacent protruding strips 41 and 42. The thin hard mask HM may comprise, but not limited to, silicon nitride (SiN), silicon oxynitride (SiON), silicon oxide ($SiO_2$), or combination thereof. Also, a thickness $t_H$ of the thin hard mask HM is equal to or less than a thickness $t_C$ of the conductive layer 47. In one embodiment, the thickness $t_C$ of the conductive layer 47 is in a range of, but not limited to, about 50 Å to about 200 Å. In one embodiment, the thickness $t_H$ of the thin hard mask HM is in a range of, but not limited to, about 50 Å to about 150 Å.

Figure 4D:
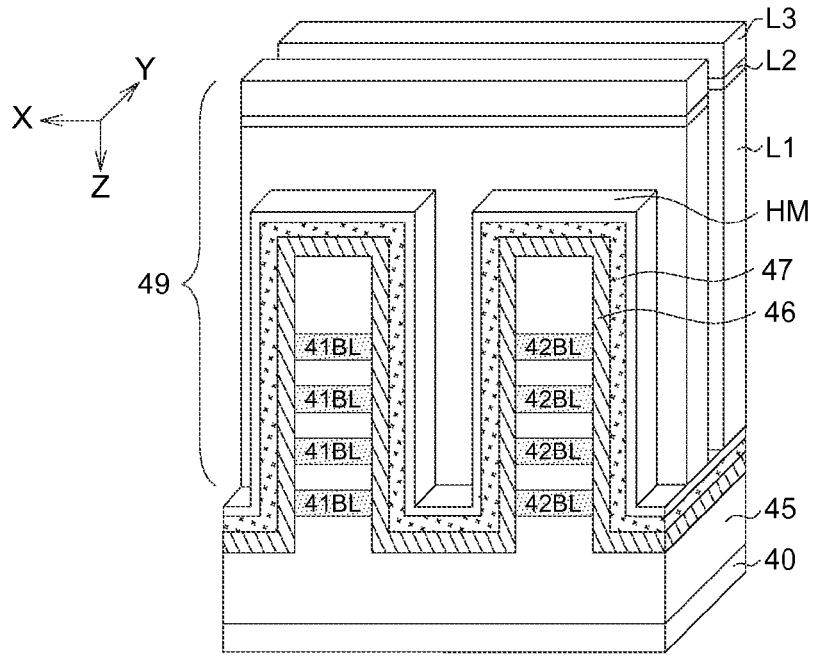

Next, a patterned photo resist 49 is formed on the thin hard mask HM and fills into the trenches 48, as shown in FIG. 4D.

Figure 4E:
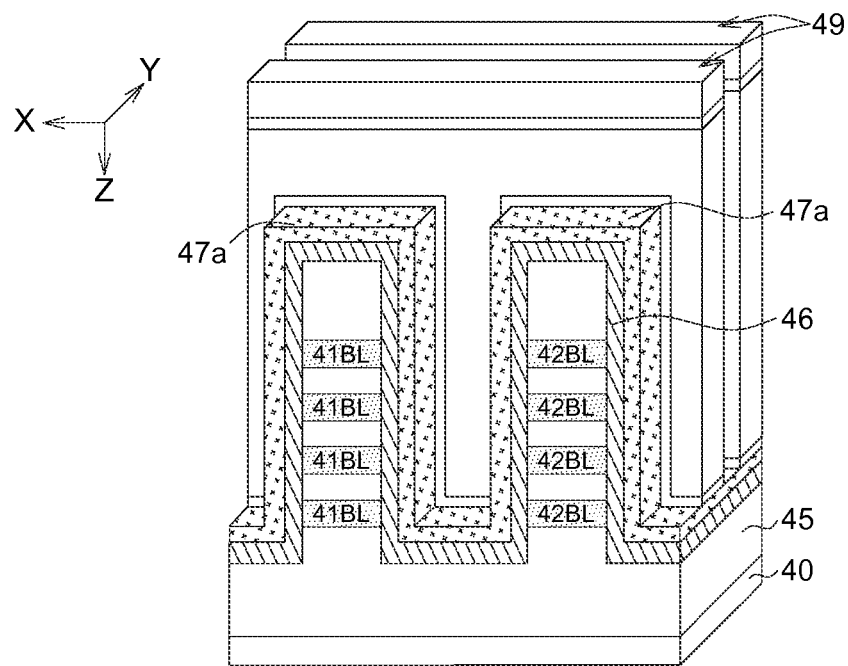

The thin hard mask HM is then patterned by isotropic etch according to the patterned photo resist 49 to form a patterned hard mask layer HM', and a portion 47a of the conductive layer 47 is exposed, as shown in FIG. 4E.

Figure 4F:
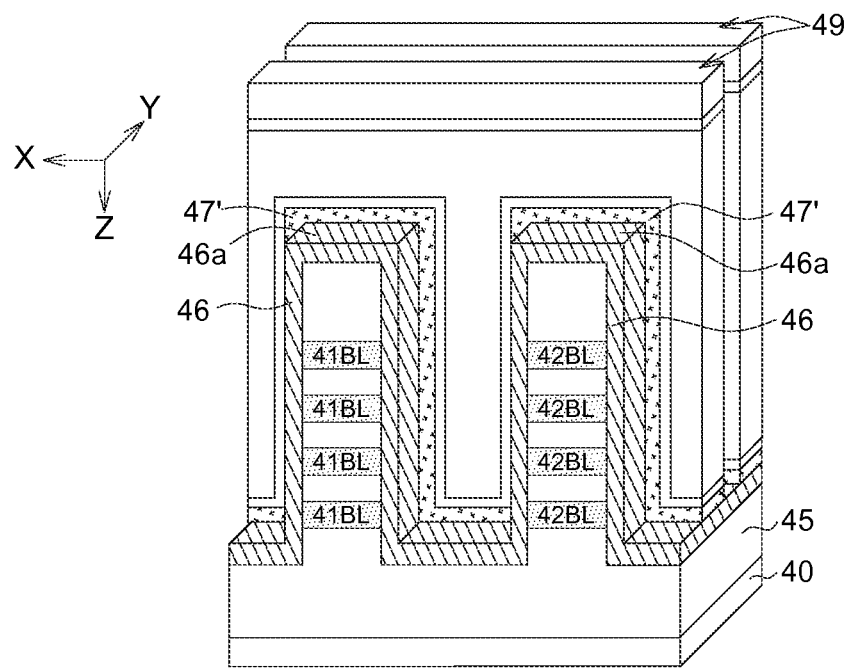

Next, the conductive layer 47 is patterned by isotropic etch, for removing the exposed portion 47a of the conductive layer 47, to form a patterned conductive layer 47' and expose a portion 46a of the charging trapping layer 46, as shown in FIG. 4F.

Figure 4G:
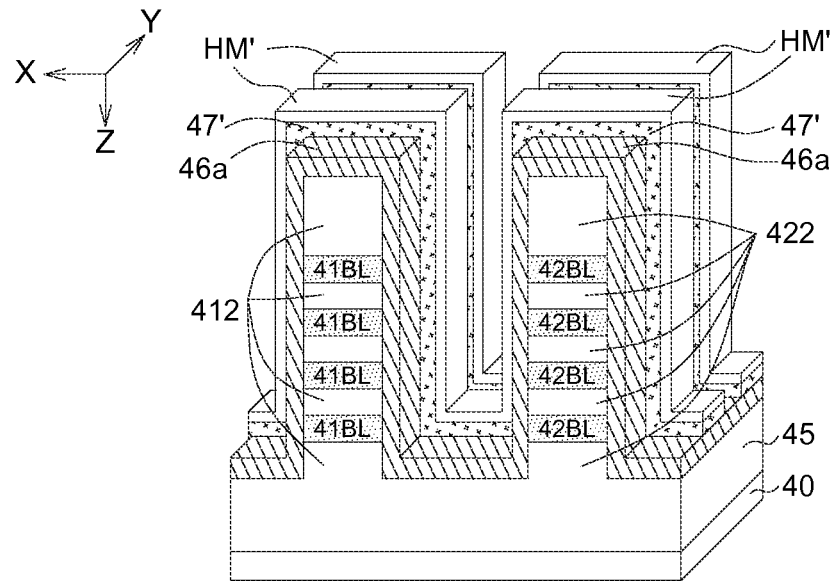
Figure 4H:
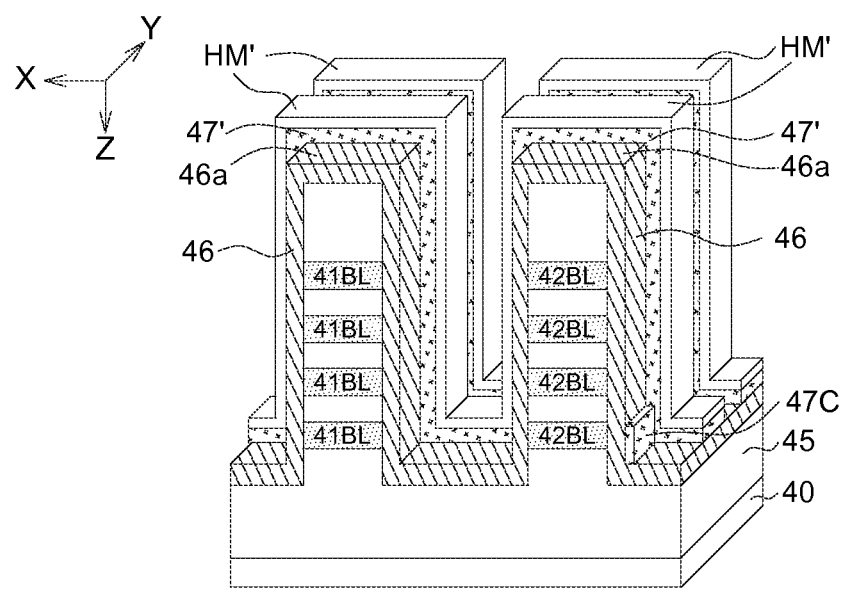

Then, the patterned photo resist 49 is removed (stripped), as shown in FIG. 4G. Also, the method may further comprise the step of removing the conductive residues, such as by an oxidization process. Similarly, the removal of the patterned photo resist 49 can be performed before etching the conductive layer 37.

Figure 5:
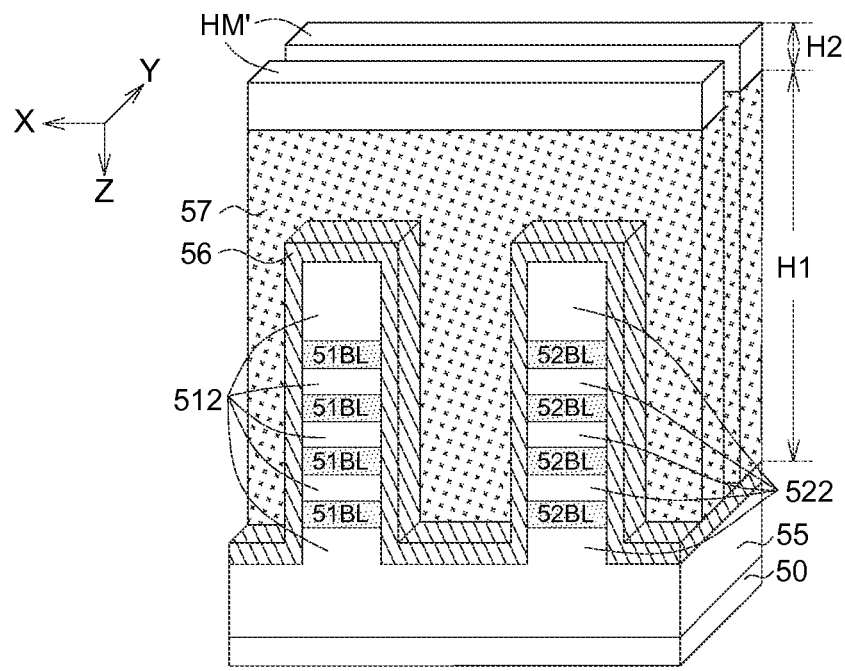
FIG. 5 shows a word-line (WL) patterning of a conventional vertical gate (VG) semiconductor device.

FIG. 5 shows a word-line (WL) patterning of a conventional vertical gate (VG) semiconductor device. Each of the protruding strips 51 and 52 is a multilayer structure, also comprising plural conductive layers (such as the bit lines 51 BL and 52 BL, made of polysilicon) and plural insulating layers (such as the insulators 512 and 522) alternately stacked on an insulation surface of the substrate 50. An insulation layer 55, such as SiO2, is formed on the substrate 50 for providing the insulation surface, and connected to the bottom insulating layers (such as 512 and 522) of the protruding strips 51 and 52, as shown in FIG. 5. After forming the charging trapping layer 56 on the protruding strips 51 and 52, a polysilicon layer (with a height of H1) is deposited on the charging trapping layer 56 and fills the spaces between the protruding strips. A hard mask (with a height of H2) is then deposited on the polysilicon layer, and patterned to be a patterned hard mask for the WL patterning The polysilicon layer is then patterned according to the patterned hard mask HM' to form the poly gates 57, as shown in FIG. 5. Since higher (H1+H2), thinner, or large aspect ratio of height to width patterns of the poly gates 57 and the patterned hard mask HM' are formed in the conventional method, the poly gates 57 would be fallen down or bended easily during the manufacturing process. The method of the embodiment solves this issue. Compared to the structure manufactured by conventional process, the structure manufactured by the embodiment has an U-shaped poly gate (as shown in FIG. 4G) and would be more strong and solid, not be fallen down or bended easily during the manufacturing process. Thus, the yield of the product manufactured by the embodiment has been greatly improved.

Figure 6:
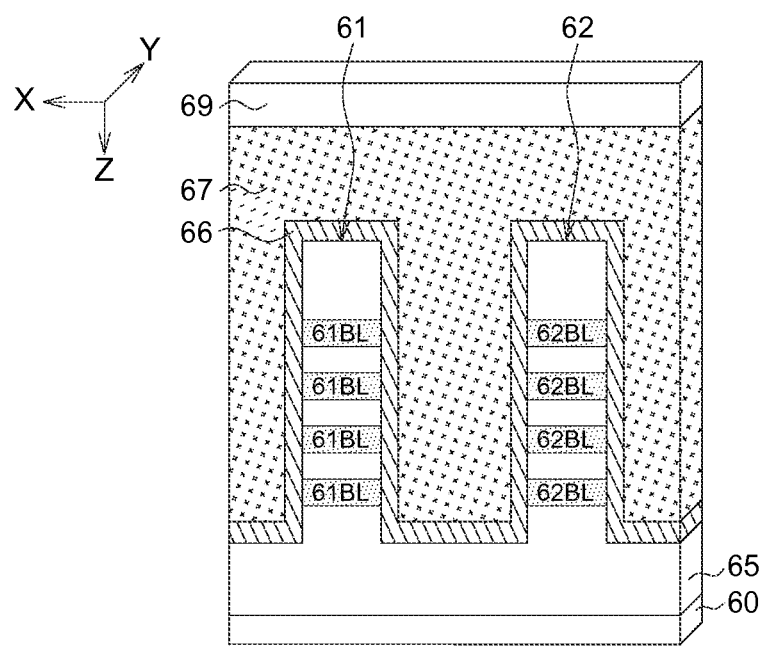
FIG. 6 illustrates a typical VG cell of a conventional VG semiconductor device.
Figure 7:
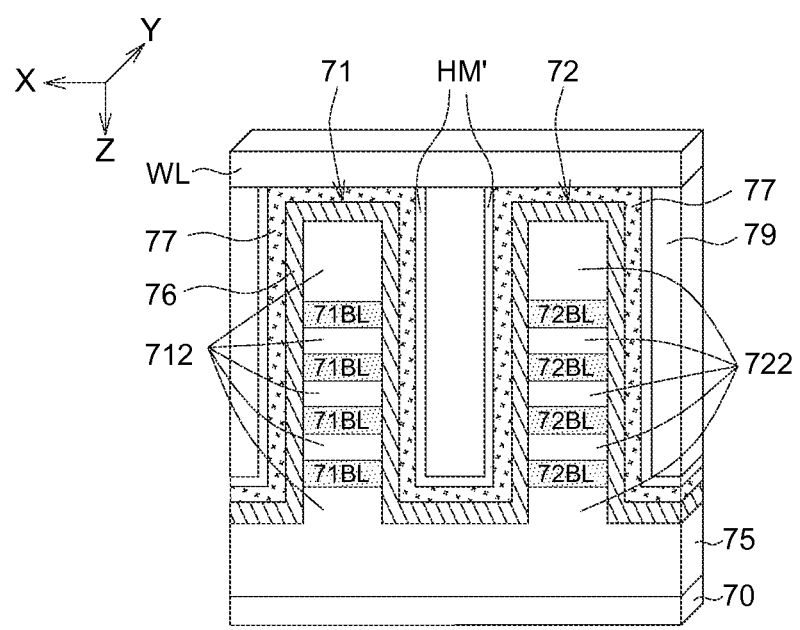
FIG. 7 illustrates a VG cell of a VG semiconductor device manufactured by the method of the embodiment.

The structures manufactured by the conventional method and by the embodied method are different, by presenting the thin conductive layer with the U-shaped cross section. Take the vertical gate (VG) semiconductor devices for example. Please refer to FIG. 6 and FIG. 7. FIG. 6 illustrates a typical VG cell of a conventional VG semiconductor device. FIG. 7 illustrates a VG cell of a VG semiconductor device manufactured by the method of the embodiment. As shown in FIG. 6, under a dielectric 69, the poly gate 67 is formed on the charging trapping layer 66 (deposited on the protruding strips 61 and 62) and fills in the spaces between the protruding strips 61 and 62. The convectional pattern of the poly gate 67 has large aspect ratio of height to width pattern, and could be fallen down or deformed easily during the manufacturing process. As shown in FIG. 7, under a WL (for example made of WSi, W, CoSi, or other suitable materials), the thin conductive layers 77 (as gate) are formed outsides of the charge trapping layers 76 and lined between the adjacent charging trapping layers 76, while the charging trapping layers 76 are formed outsides of the protruding strips 71 and 72, and lined between the adjacent protruding strips 71 and 72. Two adjacent thin conductive layers 77 are configured to present an U-shaped cross-section. The device further comprises the patterned hard masks HM' formed outsides of the thin conductive layers 77 and lined between the adjacent thin conductive layers 77, wherein the patterned hard masks HM' are configured to present an U-shaped cross-section, and the dielectric layer 79 fills spaces between the patterned hard masks HM'. A thickness of the patterned thin hard masks HM' is equal to or less than a thickness of the thin conductive layer 77. Similar to FIG. 7, in the VC semiconductor device, the thin conductive layer 27 functioning as channel presents an U-shaped cross-section (as shown in FIG. 2B). According to the VG semiconductor devices of FIG. 6 and FIG. 7 and manufacturing method as described above, the device of the embodiment as shown in FIG. 7 has solid structure and reliable electrical properties (ex: no deformed or collapsed issues), and the time for manufacturing the device of the embodiment as shown in FIG. 7 can also be saved since the gate etch time can be reduced, thereby reducing the manufacturing cost.

It is noted that the manufacturing methods as described above are provided for illustration, and people who known in the art could adjust and modify the steps based on the knowledge or the steps above. The disclosure is not limited to the steps as disclosed above, and the exemplified steps could be adjusted and changed based on the actual needs of the practical applications. According to the aforementioned description, a conductive layer (for fabricating the channels or gates of the 3D semiconductor devices) is conformlly deposited on the charge chapping layer, and a thin hard mask is adopted for patterning the conductive layer, thereby solving the collapse issue (ex: fallen down or bended) of the conductive layer with thin-and-high patterns occurred in the conventional manufacturing process. Thus, a 3D memory structure with high speed and solid construction could be obtained by manufacturing methods of the disclosure. Also, the time of the manufacturing method of the embodiment can be saved (i.e. cost reduced). Therefore, the method of the embodiment adopting the thin hard mask not only enlarges the process window and increases the production yield, but also saves the production cost.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:
1. A semiconductor device, comprising:
a plurality of protruding strips vertically formed on a substrate, wherein each protruding strip is a multilayer structure, comprising a plurality of conductive layers and a plurality of insulating layers alternately stacked on an insulation surface of the substrate;
a plurality of charging trapping layers formed outsides of the protruding strips, and lined between the adjacent protruding strips;

a plurality of conductive layers formed outsides of the charge trapping layers and lined between the adjacent charging trapping layers;

a plurality of patterned hard mask layers, formed on sidewalls of the conductive layers and lined between the adjacent conductive layers, wherein the patterned hard mask layers are separated from the charging trapping layers by the conductive layers; and a dielectric layer, positioned between the conductive layers and between the protruding strips, and the dielectric layer filling spaces between the patterned hard mask layers.

2. The device according to claim 1, wherein two adjacent charging trapping layers are extended and connected to each other at bottoms of said charging trapping layers for forming between the adjacent protruding strips as a liner.

3. The device according to claim 1, wherein two adjacent conductive layers are extended and connected to each other at bottoms of said conductive layers for forming between the adjacent charging trapping layers.

4. The device according to claim 1, wherein two adjacent conductive layers are configured to present an U-shaped cross-section.

5. The device according to claim 1, being a vertical-channel (VC) semiconductor device, wherein the conductive layers are channels formed outsides of the charge trapping layers and lined between the adjacent charge trapping layers.

6. The device according to claim 1, being a vertical-gate (VG) semiconductor device, wherein the conductive layers are gates formed outsides of the charge trapping layers and lined between the adjacent charge trapping layers.

7. The device according to claim 1,
wherein the patterned hard mask layers are configured to present U-shaped cross-section, and the dielectric layer is separated from the conductive layers by the patterned hard mask layers.

* * * * *